(12) United States Patent
Mallikarjunaswamy (10) Patent No.: US 9,130,562 B2
(45) Date of Patent: Sep. 8, 2015

(54) ACTIVE ESD PROTECTION CIRCUIT (71) Applicant: Alpha and Omega Semiconductor Incorporated, Sunnyvale, CA (US)

(72) Inventor: Shekar Mallikarjunaswamy, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 188 days.

(21) Appl. No.: 13/801,723

(22) Filed: Mar. 13, 2013

(65) Prior Publication Data

US 2014/0268441 A1  Sep. 18, 2014

(51) Int. Cl.
*H03K 17/081* (2006.01)
*H02H 9/04* (2006.01)

(52) U.S. Cl.
CPC ......... *H03K 17/08104* (2013.01); *H02H 9/046* (2013.01)

(58) Field of Classification Search
USPC .......................................................... 361/56
See application file for complete search history.

(56) References Cited

U.S. PATENT DOCUMENTS

| | | | | |
|---|---|---|---|---|
| 4,016,391 | A * | 4/1977 | Kiuchi et al. ................ | 219/663 |
| 4,099,128 | A * | 7/1978 | Hooper ..................... | 327/177 |
| 7,239,200 | B2 * | 7/2007 | Ishii et al. ................... | 330/10 |
| 2004/0095120 | A1 * | 5/2004 | Kernahan .................... | 323/282 |
| 2006/0049807 | A1 * | 3/2006 | Yao .............................. | 322/22 |
| 2007/0025034 | A1 * | 2/2007 | Chaudhary et al. ......... | 361/56 |
| 2007/0252615 | A1 * | 11/2007 | Chang et al. ................ | 326/23 |
| 2007/0290738 | A1 * | 12/2007 | Wendt et al. ................ | 327/427 |
| 2009/0154035 | A1 * | 6/2009 | Galvano et al. ............. | 361/56 |
| 2010/0283523 | A1 * | 11/2010 | Cheung et al. .............. | 327/178 |
| 2012/0212196 | A1 * | 8/2012 | Ozasa .......................... | 323/271 |
| 2012/0300349 | A1 * | 11/2012 | Abou-Khalil et al. ...... | 361/56 |
| 2013/0278301 | A1 * | 10/2013 | Huynh ......................... | 327/110 |
| 2014/0167099 | A1 * | 6/2014 | Mergens ..................... | 257/109 |

* cited by examiner

*Primary Examiner* — Thienvu Tran
*Assistant Examiner* — Angela Brooks
(74) *Attorney, Agent, or Firm* — Van Pelt, Yi & James LLP (57) ABSTRACT

A high-voltage gate driver circuit configured to drive a high-side power switch and a low-side power switch includes an active dv/dt triggered ESD protection circuit coupled between a protected node and a power rail node. The active dv/dt triggered ESD protection circuit includes a dv/dt circuit controlling an ESD protection transistor connected between the protected node and the power rail node. The ESD protection transistor is turned on when an ESD event occurs at the protected node to conduct ESD current from the protected node to the power rail node. The dv/dt circuit is charged up after a time constant to disable the ESD protection transistor.

20 Claims, 5 Drawing Sheets

ACTIVE ESD PROTECTION CIRCUIT

BACKGROUND OF THE INVENTION

Figure 1:
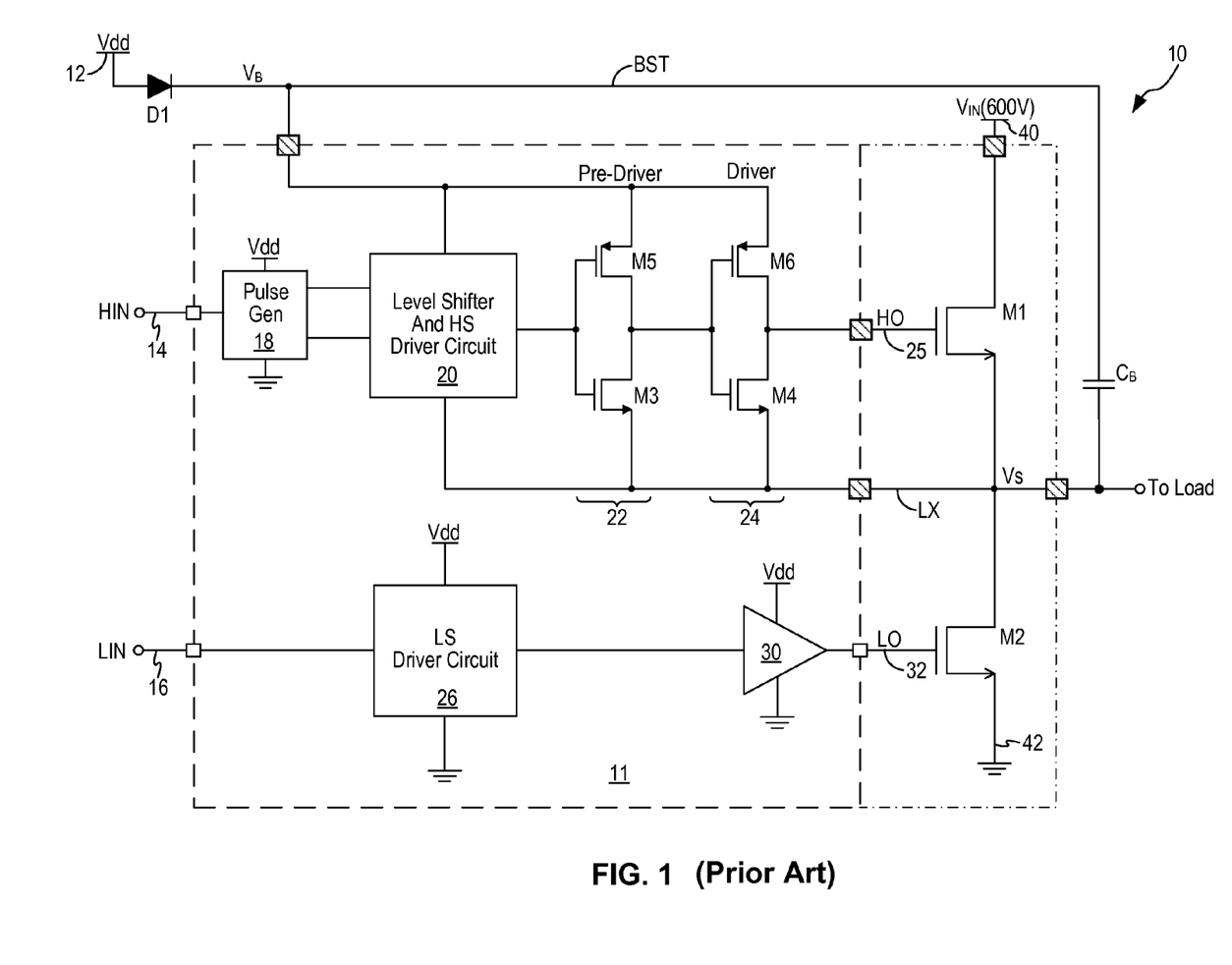
FIG. 1 is a schematic diagram of a conventional high voltage gate driver circuit.

Gate driver circuits, including high-side and low-side drivers, are used to drive power MOSFET or IGBT output transistors which are used in high voltage applications, such as motors. In some applications, the high-side driver is used to drive an N-channel power MOSFET in the high-side configuration which operates up to 600V. Conventional high voltage gate driver circuits integrate both the high-side gate driver and the low-side gate driver onto the same integrated circuit. FIG. 1 is a schematic diagram of a conventional high voltage gate driver circuit. In the example configuration shown in FIG. 1, a high voltage gate driver circuit 10 includes a gate driver integrated circuit 11 (indicated by the dotted line) housing the high-side gate driver circuit and the low-side gate driver circuit. The high voltage gate driver circuit 10 is disposed to drive a pair of power switches connected in series between a high input supply voltage $V_{IN}$ (node 40) and the ground potential (node 42). In the present illustration, the power switches are N-channel power MOSFETs M1 and M2. Also, in the present illustration, the high input supply voltage $V_{IN}$ is 600V or above. The N-channel MOSFET M1 thus has to operate up to 600V. The pair of N-channel power MOSFETs M1 and M2, under the control of the high-side drive signal HO (node 25) and the low-side drive signal LO (node 32), are alternately turned on and off to generate an output voltage signal Vs (node LX) to drive a load. The power MOSFETs M1 and M2 can be integrated onto the gate driver integrated circuit 11. More often, the power MOSFETs M1 and M2 are discrete devices and in some cases, the discrete devices are co-packaged with the gate driver integrated circuit 11 (indicated by the dot-dash line).

High voltage gate driver circuit 10 receives a high-side input signal HIN (node 14) and a low-side input signal LIN (node 16). The low-side input signal LIN is coupled to a low-side driver circuit 26 which drives a gate driver 30 to generate the low-side drive signal LO to drive power switch M2. Meanwhile, the high-side input signal HIN is coupled to high-side control circuitry, including a pulse generator 18, a level shift and high-side driver circuit 20, a pre-driver 22 and a gate driver 24. The gate driver 24 generates the high-side drive signal HO to drive power switch M1.

The high voltage gate driver circuit 10 receives a logic supply voltage Vdd (node 12). The logic supply voltage Vdd supplies the low-side control circuitry, such as the low-side driver circuit 26 and the gate driver 30. Because the high-side control circuitry is coupled to drive the high-side power switch M1 operating at a high input supply voltage $V_{IN}$, some of the high-side control circuitry are formed in a high voltage floating tub and are supplied by a boost supply voltage $V_B$ on a boost node BST. The floating tub is biased to the output voltage Vs (node LX) which is referred to as a floating supply voltage. More specifically, the pulse generator 18 is operated on the logic supply voltage Vdd and then the signals are level-shifted up so that the level shifter and high-side driver circuit 20, the pre-driver 22, and the gate driver 24 are formed in the high-voltage floating tub and are supplied by the boost supply voltage $V_B$.

The boost supply voltage $V_B$ is generated from the logic supply voltage Vdd and a boost capacitor $C_B$. More specifically, the capacitor $C_B$ is connected between the boost node BST and the output voltage Vs (node LX). A diode D1 is interposed between the logic supply voltage Vdd (node 12) and the top plate of the capacitor $C_B$ (node BST). More specifically, the anode of diode D1 is connected to the logic supply voltage (node 12) and the cathode of diode D1 is connected to the top plate (node BST) of the capacitor $C_B$. Diode D1 functions to charge the boost capacitor $C_B$ when MOSFET M2 is turned on and to provide reverse blocking when MOSFET M1 is turned on. That is, diode D1 allows current to flow from the logic supply voltage Vdd to charge up capacitor $C_B$ in a forward bias direction when MOSFET M2 is turned on. However, diode D1 prevents current from flowing back to the logic supply voltage node from the capacitor $C_B$ when MOSFET M1 is turned on. In this manner, the boost supply voltage $V_B$ is generated and is used to supply some of the high-voltage control circuitry.

The gate driver integrated circuit 11, with or without the power switches M1 and M2 co-packaged therewith, needs protection from electrostatic discharge (ESD) events. ESD events most often occur at the input/output pads or the power supply pins of an integrated circuit. ESD spikes can reach up to several thousand volts and can destroy circuitry within an integrated circuit. Accordingly, integrated circuits frequently include some kind of protection circuit for preventing high voltage ESD spikes to input/output/supply pads from reaching internal circuitry and causing permanent damages.

In particular, for high voltage gate driver circuit 10, ESD protection circuits are needed for input/output pads and supply voltage pads associated with the high-side gate driver circuit. Typically, ESD protection circuits are provided to the boost node BST, the floating supply voltage node LX, and the high input supply voltage $V_{IN}$ node 40. When the power switches are not co-packaged, the high-side drive signal HO output node 25 also needs ESD protection. But even when the power switch is co-packaged, coupling capacitance between the source and the gate of the power switch M1 may allow the ESD current to reach the high-side drive signal output node 25, damaging the transistors of the gate driver 24. Therefore ESD protection is often provided to the HO node 25 as well.

Figure 2:
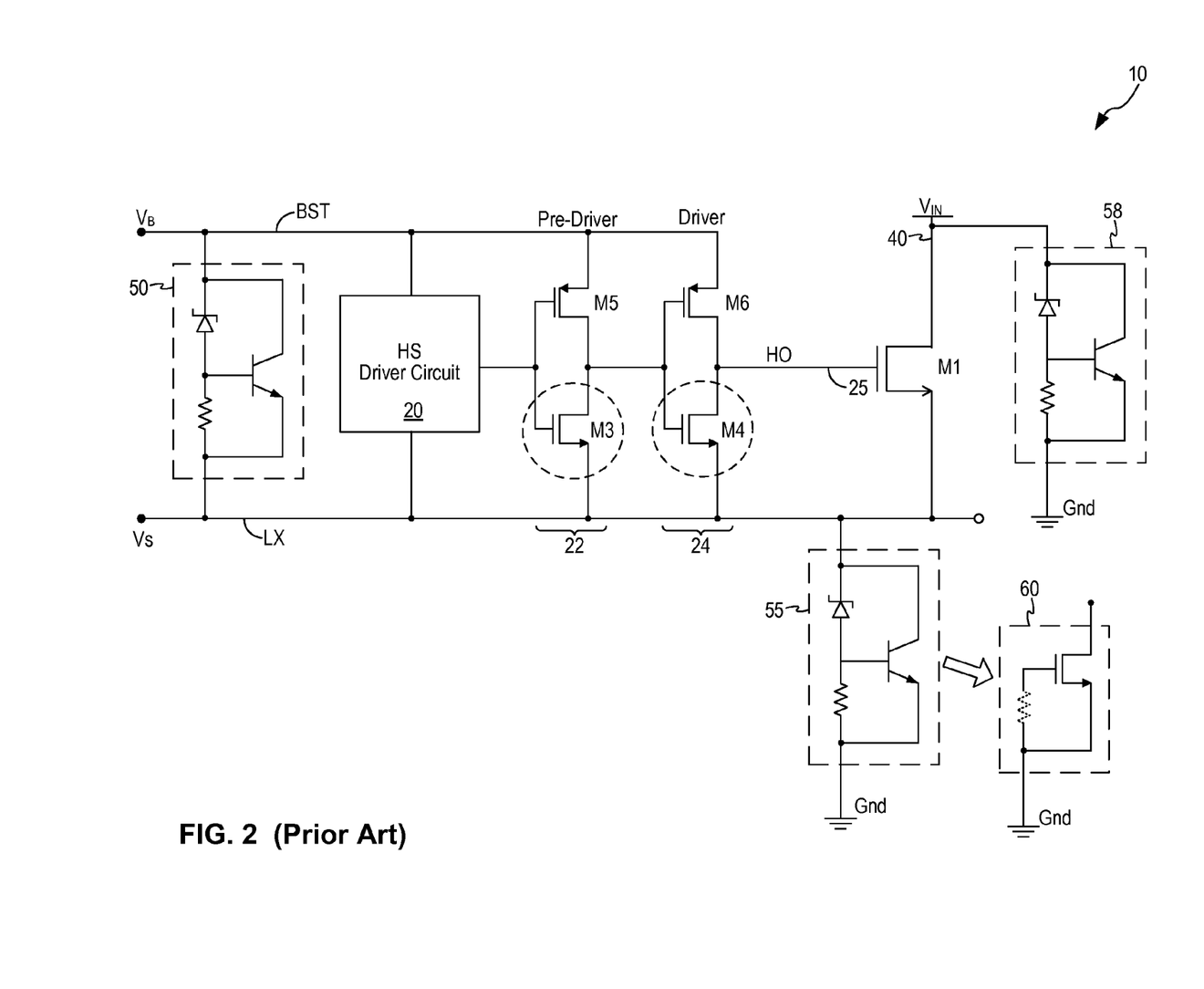
FIG. 2 illustrates the ESD protection circuits incorporated into high-side control circuitry of the high voltage gate driver circuit of FIG. 1.

Conventional ESD protection circuits rely on one or more p-n junction diodes to trigger an associated bipolar transistor connected to the input/output pad to shunt the ESD spikes to either a supply voltage node or to the ground node. For example, conventional ESD protection circuits include Zener-triggered NPN bipolar transistor, or grounded-gate NMOS transistor, or RC-gated NMOS transistor. Conventional ESD protection circuits are passive circuits and rely on breakdown of the protection transistor to shunt the current. FIG. 2 illustrates the ESD protection circuits incorporated into high-side control circuitry of the high voltage gate driver circuit of FIG. 1. In FIG. 2, only the high-side control circuitry of high voltage gate driver circuit 10 is shown and other circuit elements in driver circuit 10 are omitted to simplify the discussion. Referring to FIG. 2, an ESD protection circuit 50 is provided between the boost node BST and the floating voltage node LX to protect the boost node relative to the floating tub. In the present illustration, an ESD protection circuit 58 is provided from the $V_{IN}$ voltage node (40) to ground and an ESD protection circuit 55 is provided from the floating supply voltage node LX to ground. In the present illustration, the ESD protection circuits 50, 55, 58 are implemented as Zener-triggered NPN bipolar transistors. In other examples, the ESD protection circuit can be implemented as grounded-gate NMOS transistor 60. The gate of the NMOS transistor 60 can be grounded with or without a resistor.

ESD events often occur during manufacturing, testing or handling when the driver integrated circuit is not powered up. In that case, the NMOS transistor M4 of the gate driver circuit 24 or the NMOS transistor M3 of the pre-driver circuit 22 are most susceptible to failure as NMOS transistors break down and snap back as a result of the high current excursion while the transistors are not turned on. PMOS transistors M5 and M6 do not suffer from failures as PMOS transistors do not snap back. As such, an ESD event at the driver integrated circuit often results in failures at the NMOS transistor M3 or M4. Accordingly, integrated circuit design rules dictate ESD compliant layout for NMOS transistors M3 and M4 where drain and source ballasting is used to ease the high current and high power dissipation resulting from an ESD event while the NMOS transistors are turned off. Drain ballasting increases the size of the NMOS transistor device as a larger distance is imposed from the drain contact to poly gate. Because of ESD compliant layout, the NMOS transistors for the pre-driver and gate driver circuit for a high-side power switch are typically large in size and consume a large amount of silicon real estate.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

According to embodiments of the present invention, a high voltage gate driver circuit, formed on an integrated circuit, incorporates an active dv/dt triggered ESD protection circuit connected to an input/output/supply pad of the integrated circuit. The active dv/dt triggered ESD protection circuit includes an ESD protection transistor that is turned on during an ESD event to shunt the ESD current to a power rail, which can be the analog or power ground nodes or the floating supply voltage node. The active dv/dt triggered ESD protection circuit does not rely on the breakdown of a turned-off or deactivated protection transistor to conduct current, as is the case in conventional passive ESD protection schemes. Rather, in the ESD protection circuit of the present invention operates in an active mode where the ESD protection transistor is turned on to conduct the ESD current during an ESD event.

In embodiments of the present invention, the high voltage gate driver circuit incorporates an active dv/dt triggered ESD protection circuit coupled between the boost node and the floating supply voltage node. The active ESD protection circuit turns on the ESD protection transistor during an ESD event at the boost node to conduct the ESD current from the boost node to the floating supply voltage node. Furthermore, in some embodiments, the active dv/dt triggered ESD protection circuit generates a control signal coupled to the high-side driver circuit to cause the high-side driver circuit to turn on the pull-down transistor of the gate driver driving the power switch. In this manner, the pull-down transistor of the gate driver in the high-side gate driver circuitry is turned on (active) to conduct ESD current to the floating supply voltage node LX during an ESD event. Device failure at the gate driver pull-down transistor due to ESD is obviated as the gate driver pull-down transistor is no longer in a passive breakdown mode during the high current ESD event. More importantly, because the gate driver pull-down transistor is turned on (active) during an ESD event, the pull-down transistor no longer requires ESD compliant layout rule. Rather, the gate driver pull-down transistor can be formed using minimum spacing between the drain contact to the polysilicon gate or between source contact to the polysilicon gate based on the design rule to reduce the silicon real estate required for the gate driver. In other words, drain ballasting at the gate driver pull-down transistor is no longer required and the high voltage gate driver circuit can be formed in a smaller silicon area.

Figure 3:
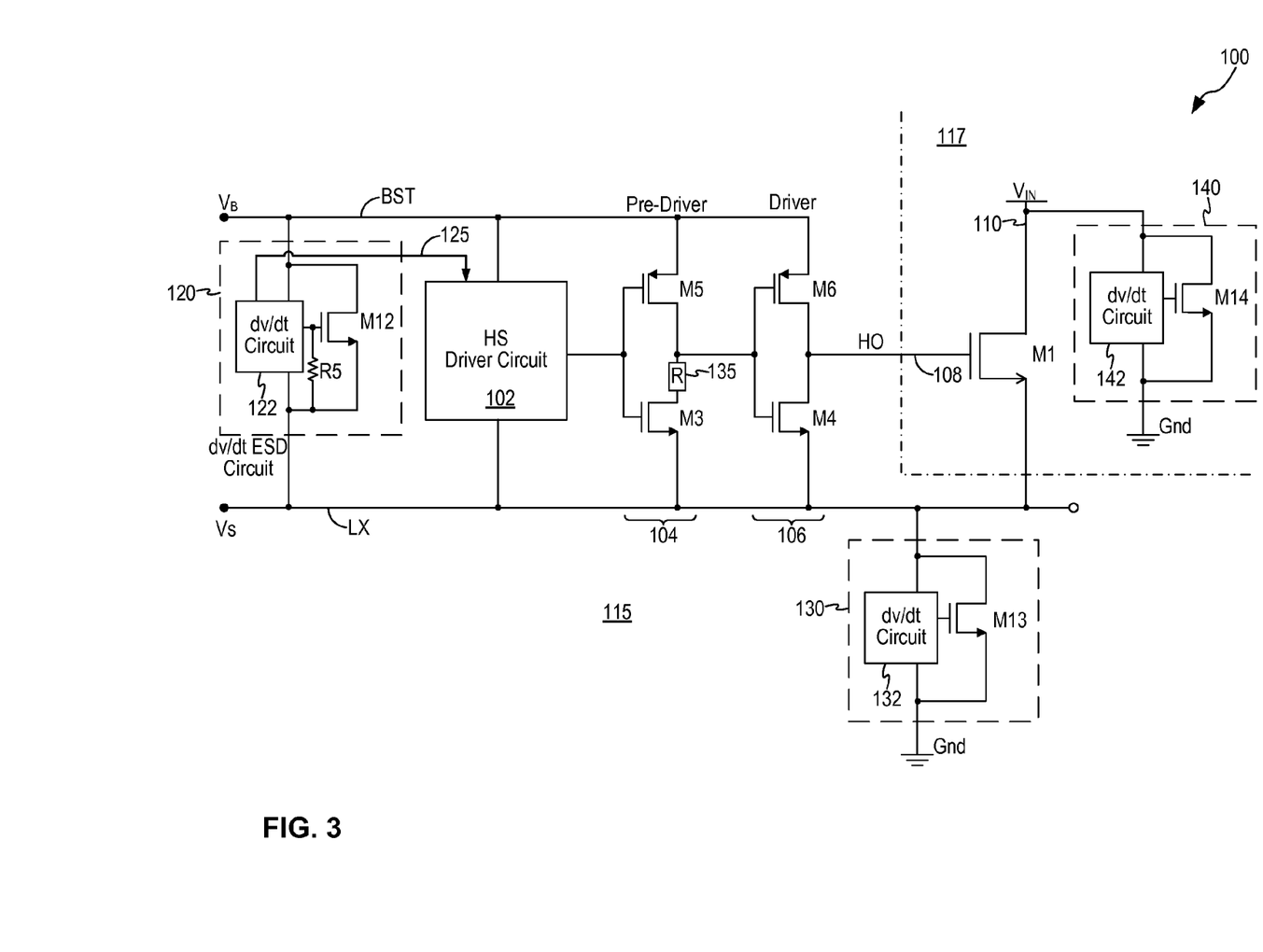
FIG. 3 is a schematic diagram illustrating a high voltage gate driver circuit incorporating one or more active dv/dt triggered ESD protection circuit in embodiments of the present invention.

FIG. 3 is a schematic diagram illustrating a high voltage gate driver circuit incorporating one or more active dv/dt triggered ESD protection circuit in embodiments of the present invention. FIG. 3 illustrates only a portion of the circuitry of the high voltage gate driver circuit 100 relating to the high-side control circuitry and the high-side power switch M1. It is understood that the high voltage gate driver circuit 100 includes other circuit elements not shown in FIG. 3 to complete the circuit operation. In embodiments of the present invention, the high voltage gate driver circuit 100 is implemented in a similar manner as gate driver circuit 10 in FIG. 1 and the above discussion for the gate driver circuit 10 with reference to FIG. 1 is incorporated herein by reference in its entirety and will not be repeated. In FIG. 3, the low-side control circuitry and pulse generator circuit are omitted in order to focus the discussion on the implementation of ESD protection. In particular, FIG. 3 illustrates primarily the high-side control circuitry where robust ESD protection is desired.

Referring to FIG. 3, the high voltage gate driver circuit 100 includes a gate driver integrated circuit 115 and a power switch integrated circuit 117. The gate driver integrated circuit 115 houses the high-side gate driver circuit and the low-side gate driver circuit. In the present illustration, only the high-side gate driver circuit is shown and includes a high-side driver circuit 102 coupled to drive a pre-driver 104 which then drives a gate driver 106. The high-side driver circuit 102, the pre-driver 104 and the gate driver 106 are formed in a high voltage floating tub and are coupled to the boost supply voltage $V_B$ (node BST) and the floating output voltage $V_S$ (node LX) as the power rails. The high-side driver circuit 102 receives control signals (not shown) generated from a high-side input signal HIN (refer to FIG. 1) which has been level-shifted up to the operating voltage range of the high-side driver circuit 102. The pre-driver 104 and the gate driver 106 are each configured as an inverter circuit including a pull-up transistor (e.g. PMOS transistors M5, M6) and a pull-down transistor (e.g. NMOS transistors M3, M4).

In the present example, the high-side control circuitry includes a pre-driver 104 and a gate driver 106 to form a two-stage gate driving circuit. In other embodiments, the gate driving circuit may include one or more stages. For example, the pre-driver may be omitted and only the gate driver 106 is used to drive the power switch. Alternately, in other examples, the gate driving circuit may include two or more stages of pre-driver and a final gate driver to provide the desired buffering and amplification for driving the power switch.

The high voltage gate driver circuit 100 is configured to drive a pair of power switches M1 and M2 which are alternately turned on and off to generate the output voltage signal Vs at node LX to drive a load. The power switches M1 and M2 are connected in series between a high input supply voltage $V_{IN}$ (node 110) and the ground potential, in the same manner as shown in FIG. 1. In the present embodiment, the power switches are N-channel power MOSFETs and the power switches M1 and M2 are controlled by the high-side drive signal HO (node 108) and the low-side drive signal LO (refer to FIG. 1) to turn on and off alternately. In this high-side control circuit shown in FIG. 3, the gate driver 106 generates the high-side output signal HO (node 108) which is coupled to drive the gate terminal of the high-side power switch M1. The high-side power switch M1 is connected between the high input supply voltage $V_{IN}$ (node 110) and the floating supply voltage node LX.

In embodiments of the present invention, the high-side power switch M1 and the low-side power switch M2 are integrated onto the gate driver integrated circuit 115. In that case, the power switch integrated circuit 117 is the same integrated circuit as the gate driver integrated circuit 115. In other embodiments, the high-side power switch M1 and the low-side power switch M2 are formed as discrete devices. In that case, the power switch integrated circuit 117 is a separate integrated circuit from the gate driver integrated circuit 115. In some embodiments, the power switch integrated circuit 117 is co-packaged with the gate driver integrated circuit 115 so that the two integrated circuits are formed inside a single package and can be treated as a single packaged device.

As described above with reference to FIG. 1, the boost supply voltage $V_B$ (node BST) is generated from a logic supply voltage Vdd through a boost capacitor $C_B$ (refer to FIG. 1). The boost capacitor $C_B$ is charged up when the low-side power switch M2 is turned on and the boost supply voltage $V_B$ is pushed up to a high voltage value when the high-side power switch M1 is turned on. More specifically, when the low-side power switch M2 is turned on and the output voltage Vs (node LX) is driven to ground, capacitor $C_B$ is charged up by the logic supply voltage Vdd (diode 1 forward biased) and a capacitor voltage Vc develops across the capacitor $C_B$ where the capacitor voltage Vc is approximately the logic supply voltage Vdd, such as around 25V when Vdd=25V. When the low-side power switch M2 is turned off and the high-side power switch M1 is turned on, the output voltage Vs is driven towards the high input supply voltage $V_{IN}$ and the boost supply voltage $V_B$ is boosted to a voltage value of Vs+Vc, such as around 600V+25V=625V when $V_{IN}$=600V. The high-side drive signal HO is driven to the boosted voltage $V_B$ (e.g. 625V) when the high-side power switch M1 is turned on. The output voltage Vs at the floating output voltage node LX can thus be driven to the full value of the high input supply voltage $V_{IN}$ (e.g. 600V).

With the high voltage gate driver circuit 100 thus configured, the input/output pads and the supply voltage pads of the integrated circuits 115 and/or 117 often require ESD protection. In particular, robust ESD protection is desired for the power supply pads and the input/output pads that are associated with nodes that are formed in the high voltage floating tub of the gate driver circuit 100. In embodiments of the present invention, the high voltage gate driver circuit 100 incorporates an active dv/dt triggered ESD protection circuit 120 coupled between the boost node BST and the floating supply voltage node LX to provide ESD protection to the boost node relative to the floating supply voltage node LX. In some embodiments, the active dv/dt triggered ESD protection circuit 120 (also referred to as "the dv/dt ESD circuit" or the "ESD protection circuit") includes a dv/dt circuit 122 and an ESD protection transistor M12. In the present embodiment, the ESD protection transistor M12 is an NMOS transistor.

In the present description, "dv/dt triggering" refers to triggering a circuit response or asserting an output signal in response to the rate of change of an input signal. In the present description, a dv/dt circuit generates a response or asserts its output signal only to voltage transients that are within a time constant of the dv/dt circuit. The dv/dt circuit does not respond or assert its output when the rate of change of the input signal is beyond the predefined time constant. In some embodiments, the dv/dt circuit incorporated in the dv/dt ESD circuit of the present invention has a time constant of 1 μsec, as most ESD events can occur up to about 1 μsec duration. When an ESD pulse with fast voltage transient is applied to the dv/dt circuit, the dv/dt circuit asserts its output signal during the 1 μsec time constant duration. Beyond the 1 μsec time constant duration, the dv/dt circuit deasserts its output signal. The dv/dt circuit is used to drive the gate terminal of the ESD protection transistor. Accordingly, the gate of the ESD protection transistor is turned on during an ESD event for the duration of the time constant (e.g., 1 μsec) of the dv/dt circuit and ESD current is shunted from the power supply rail subjected to the ESD pulse. After 1 μsec time constant period, the dv/dt circuit no longer asserts its output signal and the gate of ESD protection transistor is pulled low and the ESD protection transistor is turned off.

In some embodiments, the ESD protection transistor is implemented using a snap-back device and the dv/dt circuit can be built with a smaller time constant just enough to trigger the ESD protection transistor into snap-back or into a latched condition. In one embodiment, the ESD protection transistor is implemented using a silicon-controlled rectifier (SCR) device and dv/dt triggering is used to trigger the SCR device into an on-state.

In the dv/dt ESD circuit 120, when an ESD event occurs at the boost node BST, the rapidly increasing voltage of the ESD pulse applied to the boost node BST triggers the dv/dt circuit 122 to respond. As a result of the ESD pulse applied to the boost node, the dv/dt circuit 122 charges up based on a given time constant. Meanwhile, the ESD protection transistor M12 is turned on to conduct the ESD current from the boost node BST to the floating supply voltage node LX. When the dv/dt circuit is charged up, that is, after the time constant of the dv/dt circuit 122, the ESD protection transistor M12 is turned off. The dv/dt ESD circuit 120 is activated during an ESD event when the high voltage gate driver circuit 100 is not powered on. That is, the logic power supply voltage Vdd and the high input supply voltage $V_{IN}$ are not provided and circuit 100 is in a power off or disable state. During normal device operation, that is, when the logic power supply voltage Vdd and the high input supply voltage $V_{IN}$ are provided and circuit 100 is powered on for normal operation, the dv/dt ESD circuit 120 is disabled and the ESD protection transistor M12 is in blocking mode and the ESD protection circuit does not interfere with normal operation of circuit 100.

A salient feature of the active dv/dt triggered ESD protection circuit of the present invention is that the ESD protection transistor is turned on to conduct ESD current when the integrated circuit on which the protection circuit is housed has not been powered up. In conventional ESD protection schemes, the protection transistor is turned off or is disabled and ESD protection relies on the transistor operating in the breakdown mode to conduct the excessive ESD current. To the contrary, the ESD protection circuit of the present invention operates by turning on the ESD protection transistor during an ESD event to conduct the excessive current. Operating the ESD protection transistor in the active mode provides many advantages, including the ability to simulate the ESD response of the ESD protection circuit so that the behavior of the ESD protection circuit can be well predicted.

Furthermore, in embodiments of the present invention, the dv/dt ESD circuit 120 further generates a control signal (node 125) provided to the high-side driver circuit 102 to cause the high-side driver circuit to turn on the pull-down transistor of the gate driver 106. More specifically, the control signal (node 125) is provided to the high-side driver circuit 102 to generate an output signal to drive the pre-driver 104 which in turns drives the driver 106 to cause the pull-down transistor (NMOS transistor M4) to be turned on. In this manner, the pull-down transistor M4 of the gate driver 106 in the high-side gate driver circuitry is turned on (active) to conduct ESD current to the floating supply voltage node LX during an ESD event. Device failure at the gate driver pull-down transistor M4 due to ESD is obviated as the pull-down transistor M4 is no longer in a passive breakdown mode during the high current ESD event. When the pull-down transistor M4 is turned on, the transistor cannot be damaged by an ESD event. More importantly, because the pull-down transistor M4 is turned on (active) during an ESD event, the pull-down transistor no longer requires ESD compliant layout rule. Rather, the pull-down transistor M4 can be formed using minimum spacing design rule to reduce the silicon real estate required for the gate driver transistors. In other words, drain/source ballasting at the gate driver pull-down transistor M4 is no longer required and the high voltage gate driver circuit can be formed using a smaller silicon area.

When the high voltage gate driver circuit 100 includes one or more pre-driver stages, some of the pull-down transistor of the pre-driver stages may not be turned on during an ESD event. In some embodiments, the pre-driver pull-down transistor may be provided with additional ESD protection by providing a resistor at the drain terminal, such as a resistor 135 at the drain terminal of transistor M3 in pre-driver 104. The resistor 135 can be a ballast resistor or a lump resistor, such as a polysilicon resistor. In this manner, the gate driver pull-down transistor M4 is protected by being turned on during an ESD event while the pre-driver pull-down transistor M3 is protected by the drain resistor.

In the embodiment shown in FIG. 3, additional active dv/dt triggered ESD protection circuits are included to protect other supply pads to the ground potential. For example, a dv/dt ESD circuit 130 is formed on the gate driver integrated circuit 115 and is coupled between the floating supply voltage node LX and the ground potential. The dv/dt ESD circuit 130 provides ESD protection to the floating supply voltage node LX relative to ground. In a further example, a dv/dt ESD circuit 140 is formed on the power switch integrated circuit 117 and is coupled between the high input supply voltage node 110 and the ground potential. The dv/dt ESD circuit 140 provides ESD protection to the high input supply voltage ($V_{IN}$) node 110 relative to ground. The additional ESD protection circuits 130, 140 are optional and may be omitted or other ESD protection schemes may be used. The use of the active dv/dt triggered ESD protection circuit for the LX node and the $V_{IN}$ node is illustrative only.

Figure 4:
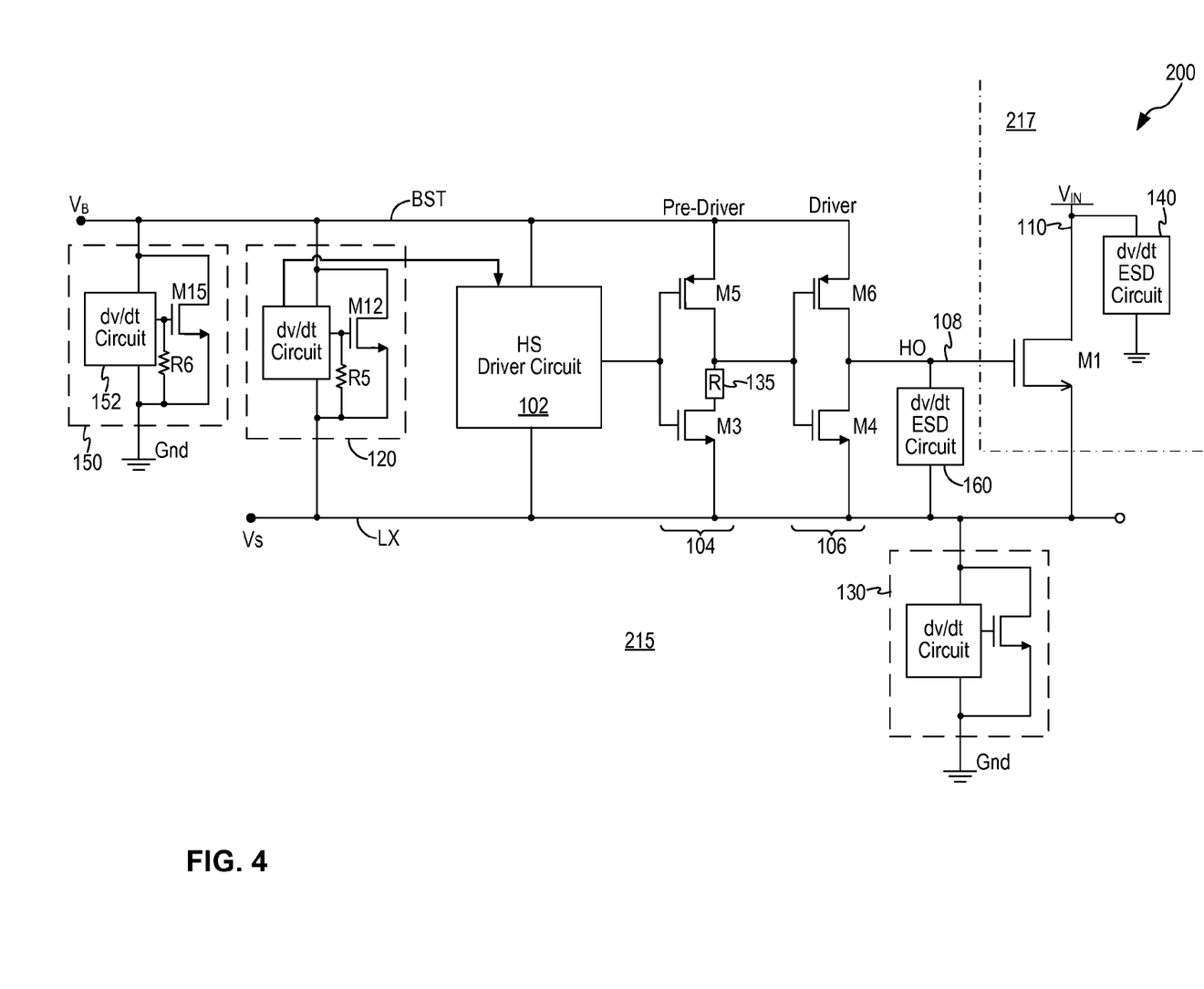
FIG. 4 is a schematic diagram illustrating a high voltage gate driver circuit incorporating one or more active dv/dt triggered ESD protection circuit in an alternate embodiment of the present invention.

Furthermore, in other embodiments, additional active dv/dt triggered ESD protection circuits can be included to protect other input/output pads and other supply pads of the gate driver circuit 100. FIG. 4 is a schematic diagram illustrating a high voltage gate driver circuit incorporating one or more active dv/dt triggered ESD protection circuit in an alternate embodiment of the present invention. In the embodiment shown in FIG. 4, it is assumed that the high voltage gate driver circuit 200 includes a gate driver integrated circuit 215 and a power switch integrated circuit 217 which are separate integrated circuits but are co-packaged. The high voltage gate driver circuit 200 includes active dv/dt triggered ESD protection circuits 120, 130 and 140 configured to provide ESD protection between the boost node BST relative to the floating supply voltage node LX, the floating supply voltage node LX to ground and the high input supply voltage $V_{IN}$ node to ground.

When the gate driver integrated circuit is a separate integrated circuit from power switch integrated circuit, the boost node needs to be protected against ESD zap to the ground potential. Furthermore, the high-side drive signal HO output node 108 often needs ESD protection from ESD zap to the floating supply voltage node. In embodiments of the present invention, the gate driver integrated circuit 215 includes a dv/dt ESD circuit 150 coupled between the boost node BST and the ground potential. The gate driver integrated circuit 215 further includes a dv/dt ESD circuit 160 coupled between the high-side drive signal HO output node 108 and the floating supply voltage node LX. The additional ESD protection circuits 150, 160 are optional and may be omitted or other ESD protection schemes may be used. The use of the active dv/dt triggered ESD protection circuit for the boost node to ground and to the HO node to the LX node is illustrative only.

In the above-described embodiments, a dv/dt triggered ESD protection circuit 120 is used to provide ESD protection between the boost node BST relative to the floating supply voltage node LX. In some embodiments, the dv/dt ESD protection circuit 120 includes a small passive pull-down device, such as resistor R5, coupled to the gate of the ESD protection transistor M12 and the floating supply voltage node LX. The pull-down resistor R5 operates to pull down on the gate of the ESD protection transistor M12 to voltage Vs so as to keep transistor M12 turned off when the transistor M12 is not being used to shunt ESD current. Keeping ESD protection transistor M12 turned off is important during charging of the boost node BST. Referring back to FIG. 1, a boost capacitor $C_B$ is coupled between the boost node BST and the floating supply voltage node LX. The boost capacitor $C_B$ is charged up when the low-side power switch M2 is turned on to generate the boost supply voltage $V_B$ which is used to supply the high-voltage control circuitry. When the ESD protection transistor M12 is coupled across the boost node BST and the floating supply voltage node LX and if the gate of the ESD protection transistor M12 is left floating, the ESD protection transistor M12 may cause leakage between the boost node BST and the floating supply voltage node LX, preventing the boost voltage $V_B$ from being charged up. Accordingly, a passive pull-down device, such as the pull-down resistor R5 in FIG. 3 and FIG. 4, can be coupled to the gate of the ESD protection transistor to keep the ESD protection transistor off when it is not used to shunt ESD current.

In some embodiments, a dv/dt triggered ESD protection circuit 150 is used to provide ESD protection between the boost node BST relative to the ground potential (FIG. 4). In that case, a pull-down device, such as resistor R6, may be coupled to the gate of the ESD protection transistor M15 to pull down on the gate of the transistor M15 to keep it turned off when the transistor is not used to shunt ESD current. As will be described in more detail below, the various dv/dt ESD circuits in the gate driver circuit 200 may be configured to share a common dv/dt circuit. Thus, a single dv/dt circuit generates the control signal for multiple ESD protection transistors. When ESD protection transistor M15 is driven by a shared dv/dt circuit, the resistor R6 may be omitted.

Figure 5:
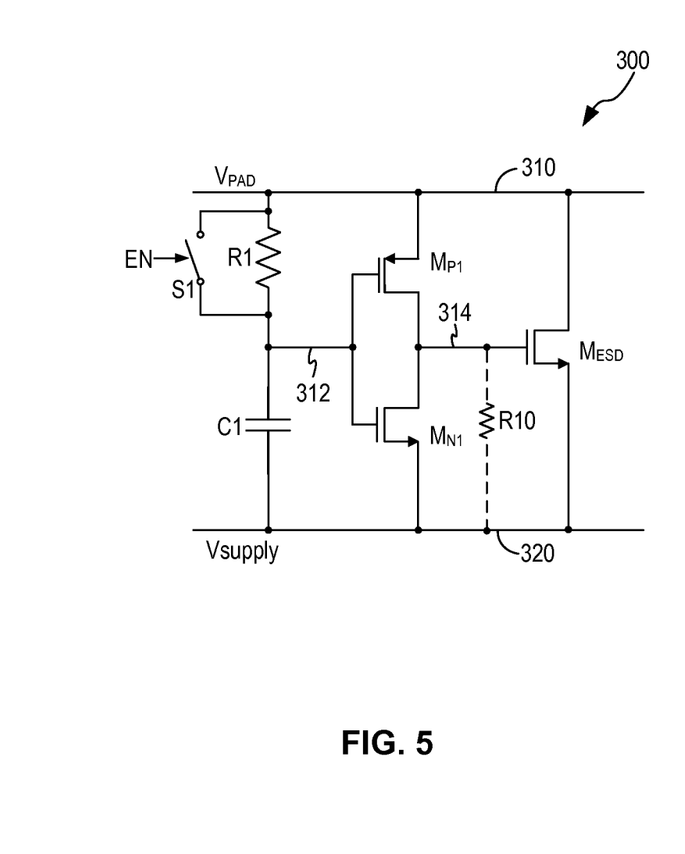
FIG. 5 is a schematic diagram of a dv/dt ESD circuit in embodiments of the present invention.

FIG. 5 is a schematic diagram of a dv/dt ESD circuit in embodiments of the present invention. Referring to FIG. 5, a dv/dt ESD circuit 300 is coupled to a node 310 for providing ESD protection to the protected node 310 relative to a power rail (node 320). The protected node 310 can be any input, output, or supply pad of the gate driver circuit. In the present description, the protected node 310 has a voltage value $V_{PAD}$ when the gate driver circuit is powered up and activated. The dv/dt ESD circuit is coupled to the power rail (node 320) as a discharge path for the ESD current. In the present description, the power rail 320 has a voltage value Vsupply. Voltage Vsupply can be the ground potential or the floating supply voltage Vs of the gate driver circuit in FIG. 3 and FIG. 4.

The dv/dt ESD circuit 300 includes an RC network including a resistor R1 and a capacitor C1 connected in series between the protected node 310 and the power rail node 320. The resistance value of resistor R1 and the capacitance value of capacitor C1 establishes a RC time constant value or a timer value. The RC network drives an inverter formed by a PMOS transistor $M_{P1}$ and an NMOS transistor $M_{N1}$. More specifically, the common node 312 between the resistor R1 and the capacitor C1 is coupled to drive the gate terminals of the PMOS transistor $M_{P1}$ and the NMOS transistor $M_{N1}$. The output node 314 of the inverter is then used to drive the ESD protection transistor $M_{ESD}$. The dv/dt ESD circuit 300 is enabled or disabled by an enable signal EN. In the present embodiment, the enable signal EN is coupled to control a switch S1 coupled across resistor R1.

In embodiments of the present invention, the ESD protection transistor $M_{ESD}$ is an NMOS transistor. In other embodiments, the ESD protection transistor $M_{ESD}$ is an N-type MOS silicon-controlled rectifier (SCR) including a P-type diffusion in the drain.

The operation of the dv/dt ESD circuit 300 is as follows. When the gate driver circuit is not yet powered up or when the gate driver circuit is disabled, the switch S1 is open and the dv/dt ESD circuit 300 operates to protect the protected node from an ESD event. When an ESD pulse is applied to the protected node 310, the rapidly increasing high voltage from the ESD pulse is supplied to the RC circuit of resistor R1 and capacitor C1. The RC circuit has a given time constant to determine the time it takes to charge up the common node 312. In other words, the RC time constant functions as a timer. For example, the RC time constant may be 1 μs, which means that the common node 312 will charge up 1 μs after the ESD pulse is applied. Meanwhile, capacitor C1 holds the common node 312 near ground. In this manner, during an ESD event and before the time constant of the RC network, PMOS transistor $M_{P1}$ is turned on while NMOS transistor $M_{N1}$ is turned off. PMOS transistor $M_{P1}$ pull up on the output node 314 which then turns on the ESD protection transistor $M_{ESD}$. Once the ESD protection transistor $M_{ESD}$ is turned on, the ESD current at the protected node 310 is conducted through the ESD protection transistor to the Vsupply node 320. In this manner, the ESD current is being dissipated by an active ESD protection transistor and does not rely on the breakdown of a passive transistor device.

After the given time constant (e.g. 1 μs), the common node 312 is charged up and the NMOS transistor $M_{N1}$ is now turned on to pull down on the gate of the ESD protection transistor $M_{ESD}$. The ESD protection transistor $M_{ESD}$ may then be turned off. In embodiments of the present invention, when the ESD protection transistor $M_{ESD}$ is implemented using a MOS silicon-controlled rectifier (SCR), the ESD protection transistor $M_{ESD}$ will remain turned on and continue to conduct ESD current even through the gate terminal is disabled as long as the ESD current is above a given holding current level. When the ESD current is dissipated and the current through the SCR ESD protection transistor drops below the given holding current level, the SCR ESD protection transistor will then be turned off.

When the high voltage gate driver circuit is powered up in normal device operation, the enable signal EN is asserted to close switch S1 which shorts out resistor R1. In that case, the voltage $V_{PAD}$ at the protected node 310 will charge up capacitor C1. The NMOS transistor MN1 is turned on to drive the gate of the ESD protection transistor $M_{ESD}$ to ground, thereby turning off the ESD protection transistor. As thus configured, the ESD protection transistor $M_{ESD}$ is disabled or turned off during normal operation of the high voltage gate driver circuit.

Figure 6:
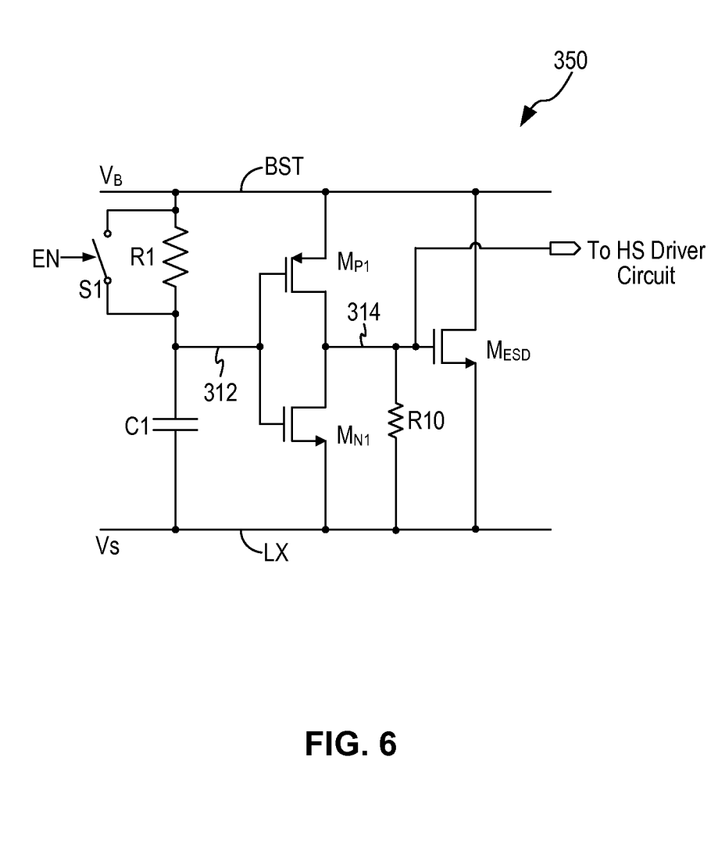
FIG. 6 is a schematic diagram of a dv/dt ESD circuit configured for use between the boost node and the floating supply voltage node in embodiments of the present invention.

In the case that the dv/dt ESD circuit 300 is applied to protect the boost node relative to the floating supply voltage node LX, a control signal is taken from the dv/dt ESD circuit to the high-side gate driver circuit 102 (FIG. 3). FIG. 6 is a schematic diagram of a dv/dt ESD circuit configured for use between the boost node and the floating supply voltage node in embodiments of the present invention. Referring to FIG. 6, the dv/dt ESD circuit 350 is coupled between the boost node BST and the floating supply voltage node LX. That is, the protected node is the boost voltage $V_B$ and the power rail is the floating output voltage Vs. The dv/dt ESD circuit 350 is configured in the same manner as the dv/dt ESD circuit 300 of FIG. 5 and like elements are given like reference numerals and will not be further described. In the case of dv/dt ESD circuit 350, the output signal (node 314) from the inverter is also coupled to drive the high-side driver circuit to turn on the pull-down transistor in the gate driver driving the power switch.

In embodiments of the present invention, the dv/dt ESD circuit 300 (FIG. 5) may include an optional passive pull-down device, such as resistor R10, to pull down on the gate of the ESD protection transistor $M_{ESD}$. More specifically, resistor R10 is connected between the gate (node 314) of the transistor $M_{ESD}$ and the lower power rail (node 320). Resistor R10 is optional and may be included when it is desirable to keep the ESD protection transistor $M_{ESD}$ turned off when the transistor is not used to shunt ESD current. In the case of the dv/dt ESD circuit 350 in FIG. 6, the ESD protection transistor $M_{ESD}$ is coupled to shunt ESD current from the boost node to the floating supply voltage node LX. In that case, resistor R10 is included to ensure the ESD protection transistor $M_{ESD}$ is turned off when not used to shunt ESD current.

As described above, a high voltage gate driver circuit may include several dv/dt ESD circuit to protect different nodes of the circuit. In embodiments of the present invention, the RC network of resistor R1 and capacitor C1 can be configured as a shared circuit element and is shared among several protection circuits. Because the RC network can be large, sharing one RC network among several dv/dt ESD circuit is more silicon area efficient.

The active dv/dt triggered ESD protection circuit of the present invention provides many advantages over conventional ESD protection schemes. First, the active dv/dt triggered ESD protection circuit can be applied in a high voltage gate driver circuit to protect the high voltage nodes, such as the boost voltage node, relative to the floating voltage node. The ESD protection circuit can be applied when the high-side power switch is integrated or when the high-side power switch is formed on a separate integrated circuit but is co-packaged.

Second, the ESD protection circuit allows standard transistor layout to be used for the gate driver pull-down device and eliminates the need for ESD compliant layout. ESD complaint layout results in larger device size because of drain/source ballasting. When the ESD protection circuit of the present invention is used, the gate driver pull-down device can be designed using minimum spacing transistor sizing without the need for drain/source ballasting. In this manner, the size of the gate driver integrated circuit is reduced.

Third, the ESD protection circuit of the present invention enables ESD response behavior to be predicted using standard circuit simulators. This is, because the ESD protection circuit relies on the ESD transistor operating in the active mode and therefore device simulation can be used to predict circuit behavior. The ESD protection circuit of the present invention ensures design portability across power integrated circuit technologies without compromising performance versus ESD immunity.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A high-voltage gate driver circuit configured to drive a high-side power switch and a low-side power switch connected in series between an input voltage node and a ground potential, the gate driver circuit including a high-side control circuit formed in a floating tub and being supplied by a boost voltage at a boost node relative to a floating supply voltage at a floating supply voltage node, the gate driver circuit comprising:
    an active dv/dt triggered ESD protection circuit coupled between a protected node and a power rail node, the active dv/dt triggered ESD protection circuit including a dv/dt circuit controlling an ESD protection transistor, the dv/dt circuit being connected between the protected node and the power rail node and the ESD protection transistor having a first current handling terminal connected to the protected node, a second current handling terminal connected to the power rail node and a control terminal controlled by the dv/dt circuit, the ESD protection transistor being turned on in response to an ESD event occurring at the protected node to conduct ESD current from the protected node to the power rail node, the dv/dt circuit being charged up after a time constant to disable the ESD protection transistor.

2. The high-voltage gate driver circuit of claim 1, wherein the ESD protection transistor comprises a MOS silicon-controlled rectifier, the ESD protection transistor remains turned on after the dv/dt circuit is charged up to disable the ESD protection transistor in response to the ESD current being conducted remaining above a given threshold, the ESD protection transistor being disabled after the dv/dt circuit is charged up and the ESD current drops below the given threshold.

3. The high-voltage gate driver circuit of claim 1, wherein the active dv/dt triggered ESD protection circuit comprises:
    an RC network including a resistor and a capacitor connected in series between the protected node and the power rail node, the RC network providing the time constant of the dv/dt circuit; and
    an inverter including a PMOS transistor and an NMOS transistor connected in series between the protected node and the power rail node, the PMOS and NMOS transistors having their gate terminals connected to a common node of the RC network and their drain terminals coupled to control the ESD protection transistor.

4. The high-voltage gate driver circuit of claim 3, wherein the active dv/dt triggered ESD protection circuit further comprises:
    a switch connected across the resistor in the RC network and controlled by an enable signal, the switch being closed in response to the enable signal in response to the gate driver circuit being powered up for normal operation and the switch being open in response to the gate driver circuit being not powered up.

5. The high-voltage gate driver circuit of claim 1, wherein the active dv/dt triggered ESD protection circuit is coupled between the boost node as the protected node and the floating supply voltage node as the power rail node.

6. The high-voltage gate driver circuit of claim 5, wherein the active dv/dt triggered ESD protection circuit generates a control signal in response to an ESD event occurring at the boost node relative to the floating supply voltage node, the control signal being coupled to the high-side control circuit to cause the high-side control circuit to turn on a pull-down transistor of a gate driver driving the high-side power switch, the pull-down transistor of the gate driver being turn on during the ESD event.

7. The high-voltage gate driver circuit of claim 6, wherein the high-side control circuit comprises a high-side driver circuit configured to drive a gate driver, the gate driver in turn driving the high-side power switch, the gate driver including a pull-up transistor and the pull-down transistor, the pull-down transistor being formed without using source/drain ballasting.

8. The high-voltage gate driver circuit of claim 1, wherein the active dv/dt triggered ESD protection circuit is coupled between the boost node as the protected node and the ground potential as the power rail node.

9. The high-voltage gate driver circuit of claim 1, wherein the high-side control circuit generates a high-side drive signal at a high-side drive signal output node, and the active dv/dt triggered ESD protection circuit is coupled between the high-side drive signal output node as the protected node and the floating supply voltage node as the power rail node.

10. The high-voltage gate driver circuit of claim 1, wherein the active dv/dt triggered ESD protection circuit is coupled between the floating supply voltage node as the protected node and the ground potential as the power rail node.

11. The high-voltage gate driver circuit of claim 1, wherein the active dv/dt triggered ESD protection circuit is coupled between the input voltage node as the protected node and the ground potential as the power rail node.

12. The high-voltage gate driver circuit of claim 1, wherein the high-side control circuit comprises a high-side driver circuit configured to drive a pre-driver, the pre-driver driving a gate driver, the gate driver in turn driving the high-side power switch, the pre-driver including a pull-up transistor and a pull-down transistor, a resistor being coupled to the source terminal of the pull-down transistor.

13. The high-voltage gate driver circuit of claim 1, wherein the active dv/dt triggered ESD protection circuit further comprises a passive pull-down device coupled to a control terminal of the ESD protection transistor.

14. The high-voltage gate driver circuit of claim 13, wherein the passive pull-down device comprises a resistor.

15. The high-voltage gate driver circuit of claim 1, wherein the active dv/dt triggered ESD protection circuit comprises a first dv/dt circuit controlling a first ESD protection transistor connected between a first protected node and a first power rail node; and the gate driver circuit further comprises:

a second ESD protection transistor connected between a second protected node and a second power rail node, the second ESD protection transistor being controlled by the first dv/dt circuit.

16. The high-voltage gate driver circuit of claim 15, wherein the first protected node is the same as or different from the second protected node; and the first power rail node is the same as or different from the second power rail node.

17. The high-voltage gate driver circuit of claim 15, wherein the first power rail node is the same as or different from the second power rail node.

18. A high-voltage gate driver circuit configured to drive a high-side power switch and a low-side power switch connected in series between an input voltage node and a ground potential, the gate driver circuit including a high-side control circuit formed in a floating tub and being supplied by a boost voltage at a boost node relative to a floating supply voltage at a floating supply voltage node, the gate driver circuit comprising:

an active dv/dt triggered ESD protection circuit coupled between the boost node and the floating supply voltage node, the active dv/dt triggered ESD protection circuit including a dv/dt circuit controlling an ESD protection transistor connected between the boost node and the floating supply voltage node, the ESD protection transistor being turned on in response to an ESD event occurring at the boost node to conduct ESD current from the boost node to the floating supply voltage node, the dv/dt circuit being charged up after a time constant to disable the ESD protection transistor, wherein the active dv/dt triggered ESD protection circuit generates a control signal in response to an ESD event occurring at the boost node relative to the floating supply voltage node, the control signal being coupled to the high-side control circuit to cause the high-side control circuit to turn on a pull-down transistor of a gate driver driving the high-side power switch, the pull-down transistor of the gate driver being turn on during the ESD event.

19. The high-voltage gate driver circuit of claim 18, wherein the high-side control circuit comprises a high-side driver circuit configured to drive a gate driver, the gate driver in turn driving the high-side power switch, the gate driver including a pull-up transistor and the pull-down transistor, the pull-down transistor being formed without using source/drain ballasting.

20. The high-voltage gate driver circuit of claim 18, wherein the ESD protection transistor comprises a MOS silicon-controlled rectifier, the ESD protection transistor remains turned on after the dv/dt circuit is charged up to disable the ESD protection transistor in response to the ESD current being conducted remaining above a given threshold, the ESD protection transistor being disabled after the dv/dt circuit is charged up and the ESD current drops below the given threshold.

\* \* \* \* \*